(12) United States Patent
Huang et al.

(10) Patent No.: US 7,602,006 B2
(45) Date of Patent: Oct. 13, 2009

(54) SEMICONDUCTOR FLASH DEVICE

(75) Inventors: Chien-Chao Huang, Hsin-Chu (TW); Chi Min-Hwa, Taipei (TW); Fu-Liang Yang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 507 days.

(21) Appl. No.: 11/111,282

(22) Filed: Apr. 20, 2005

(65) Prior Publication Data

US 2006/0237770 A1    Oct. 26, 2006

(51) Int. Cl.
*H01L 29/94*    (2006.01)

(52) U.S. Cl. .................................. 257/316; 257/E21.3

(58) Field of Classification Search .......... 257/316–317
See application file for complete search history.

(56) References Cited

U.S. PATENT DOCUMENTS

| | | | | |
|---|---|---|---|---|
| 3,950,738 | A * | 4/1976 | Hayashi et al. | 365/185.04 |
| 2001/0002712 | A1* | 6/2001 | Horiguchi et al. | 257/315 |
| 2002/0028541 | A1* | 3/2002 | Lee et al. | 438/149 |
| 2004/0159881 | A1* | 8/2004 | Chindalore et al. | 257/324 |

OTHER PUBLICATIONS

Greg Atwood, "Future Directions and Challenges for ETox Flash Memory Scaling", IEEE Transactions On Device And Materials Reliability, vol. 4, No. 3, Sep. 2004, pp. 301-305.

Kinam Kim et al, "Future Memory Technology including Emerging New Memories", Proc. 24th International Conference On Microelectronics (Miel 2004), vol. 1, NIS, Serbia And Montenegro, May 16-19, 2004, pp. 377-384.

R. People et al., "Modulation doping in $Ge_xSi_{1-x}$/Si strained layer heterostructures", at http://apl/aip.org/apl/copyright.jsp, pp. 1231-1233, Sep. 17, 1984.

R. Dingle et al., "Electron mobilities in modulation-doped semiconductor heterojunction superlattices", at http://apl.aip.org/apl/copyright.jsp, pp. 665-667, Jul. 27, 1978.

H. L. Stormer et al., Two-dimensional electron gas at differentially doped $GaAs-Al_xGa_{1-x}$ As heterojunction interface, J. Vac. Sci. Technol., 16(5), Sep./Oct. 1979, 1979 American Vacuum Society, pp. 1517-1519.

G. Abstreiter et al., Strain-Induced Two-Dimensional Electron Gas in Selectively Doped $Si/Si_x Ge_{1-x}$ Superlattices, Physical Review Letters, vol. 54, No. 22, Jun. 3, 1985.

* cited by examiner

*Primary Examiner*—Charles D. Garber
*Assistant Examiner*—Elias Ullah
(74) *Attorney, Agent, or Firm*—Duane Morris LLP

(57) ABSTRACT

A flash memory device includes a floating gate made of a multi-layered structure. The floating gate includes a hetero-pn junction which serves as a quantum well to store charge in the floating gate, thus increasing the efficiency of the device, allowing the device to be operable using lower voltages and increasing the miniaturization of the device. The floating gate may be used in n-type and p-type devices, including n-type and p-type fin-FET devices. The stored charge may be electrons or holes.

15 Claims, 6 Drawing Sheets

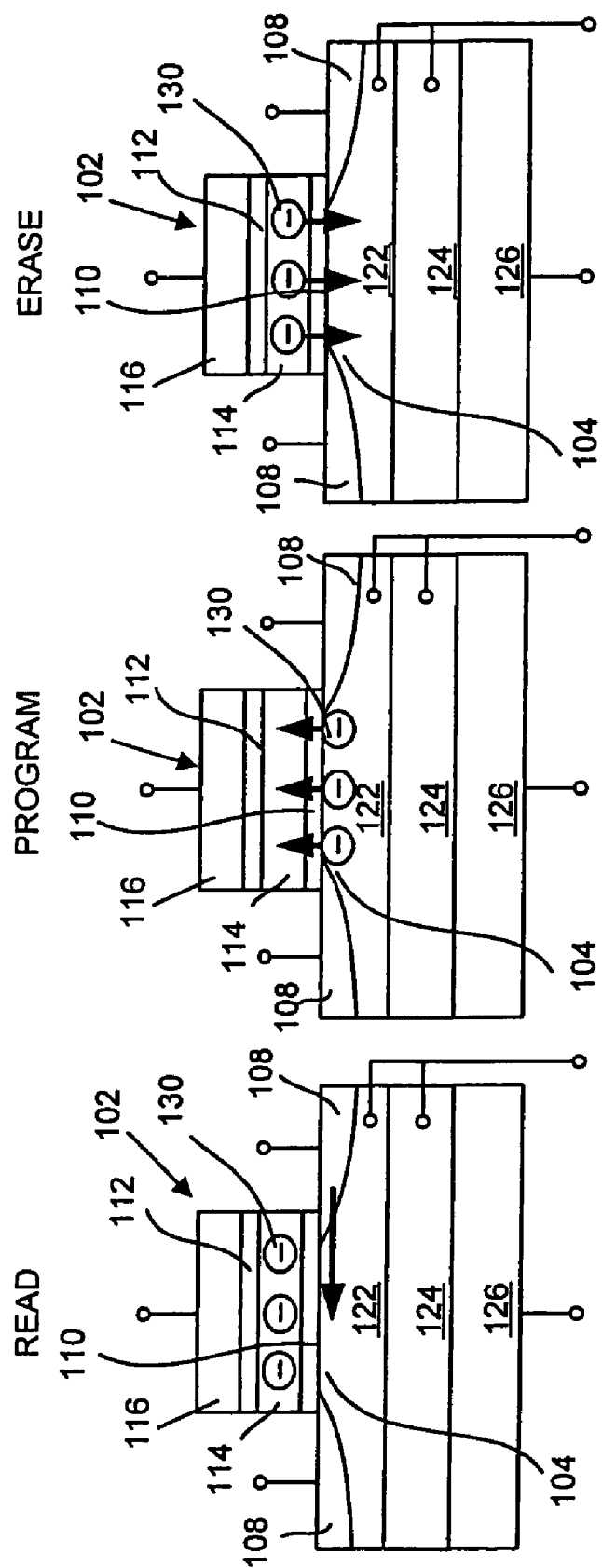

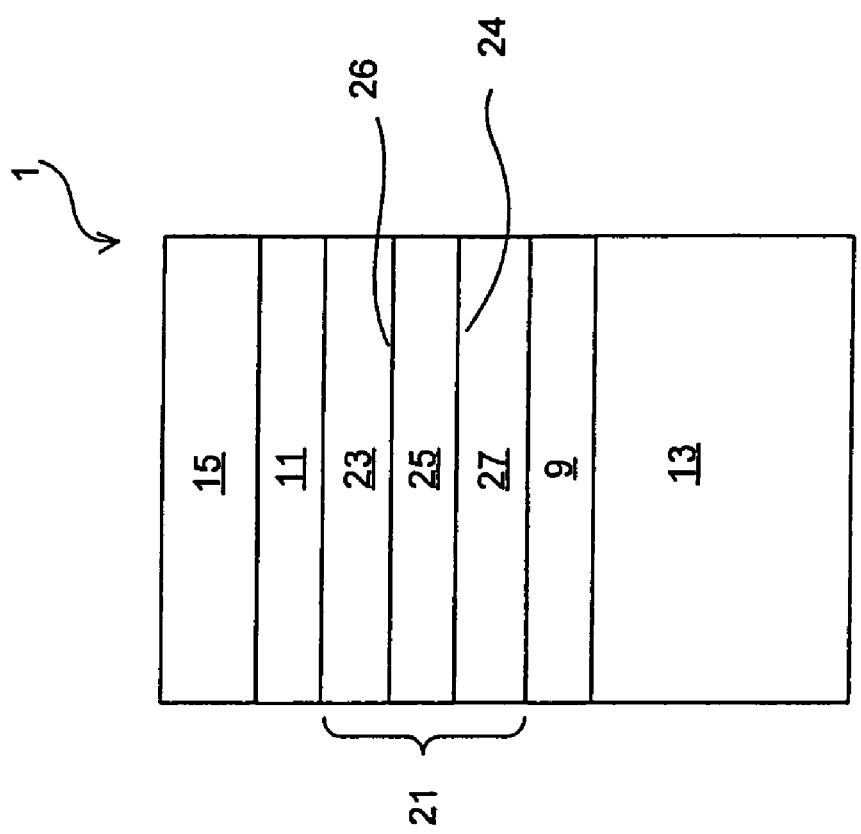
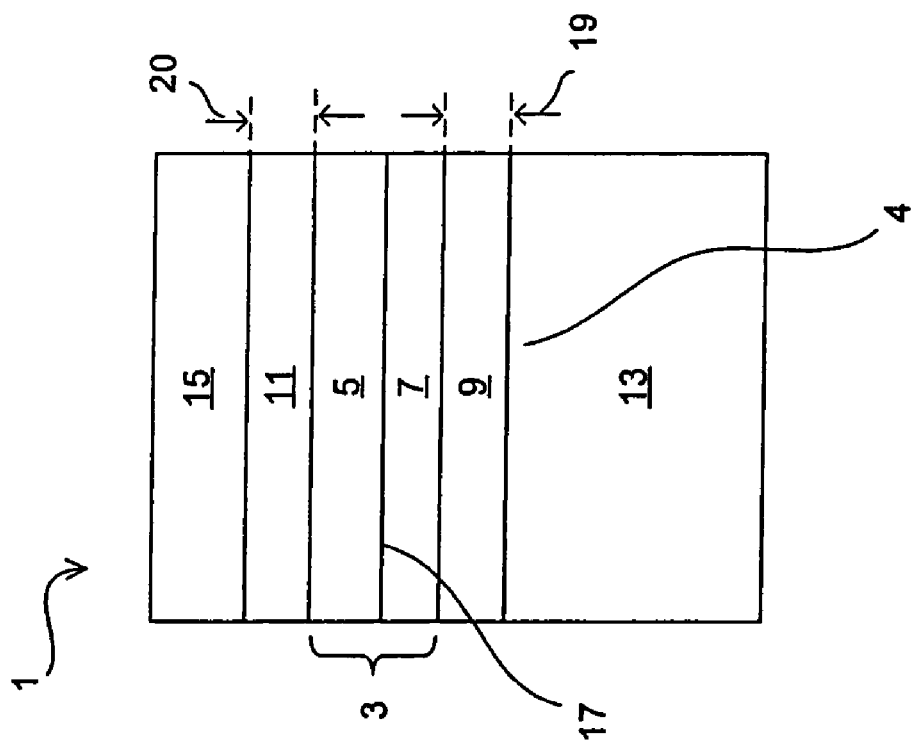

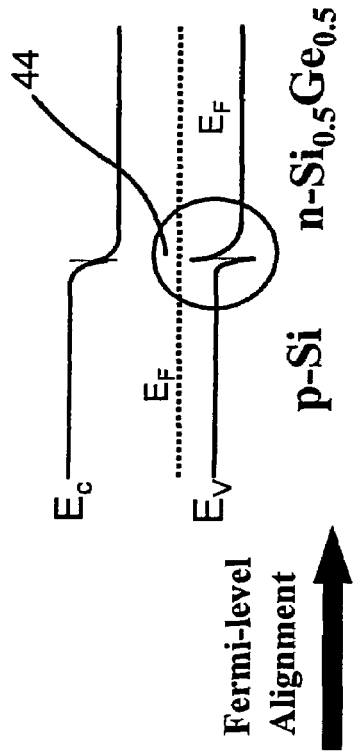
FIG. 4A
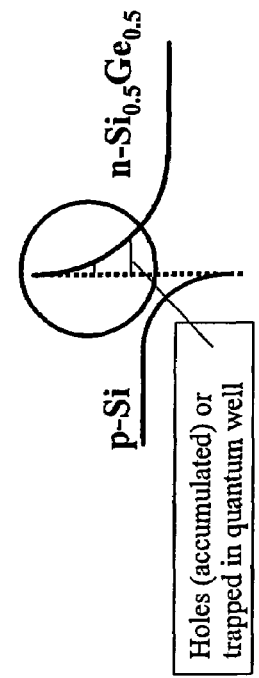
FIG. 4B
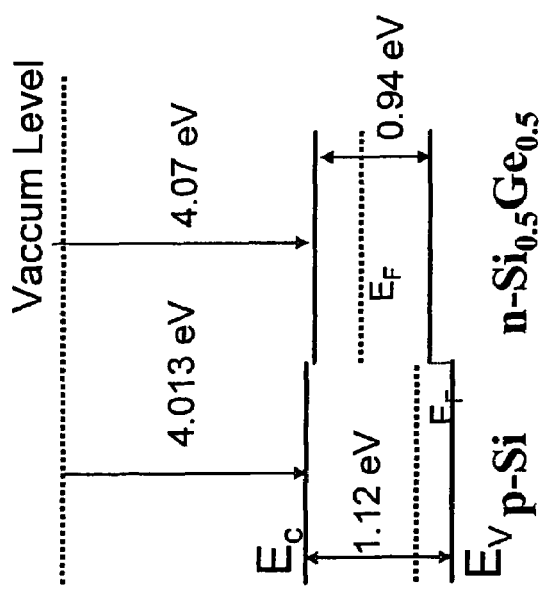
FIG. 4C
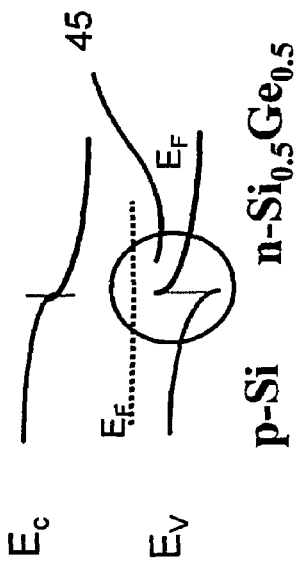

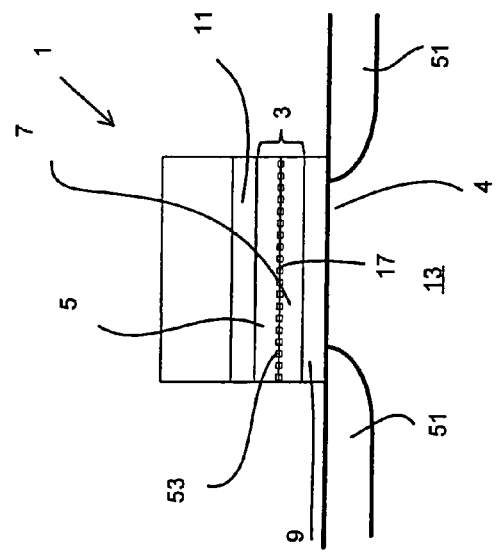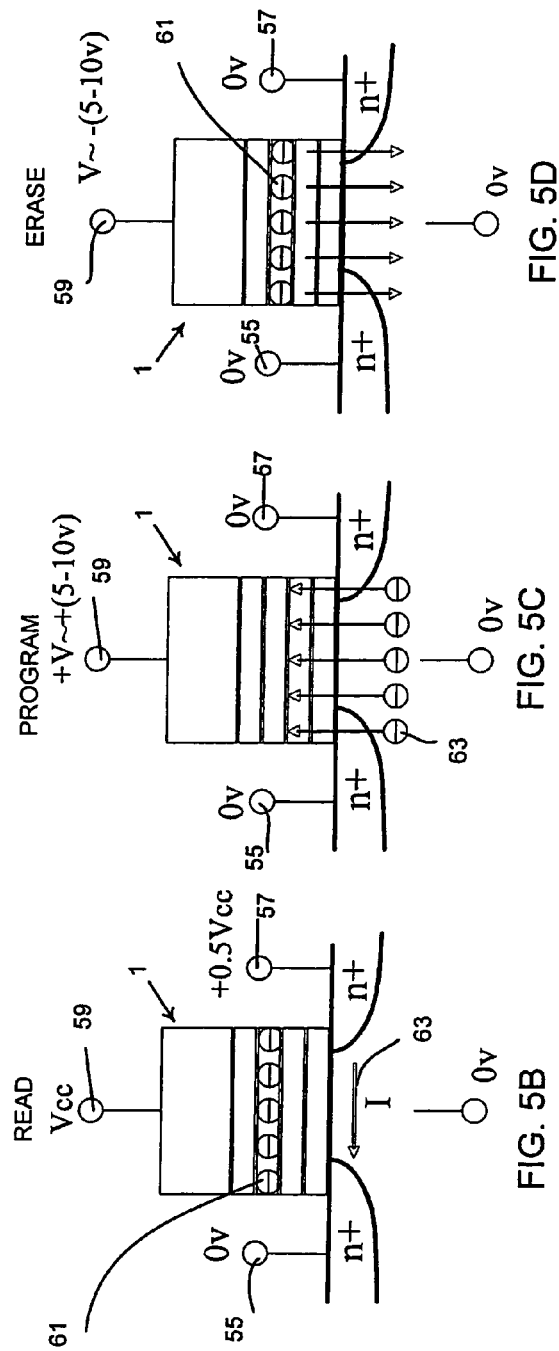

SEMICONDUCTOR FLASH DEVICE

FIELD OF THE INVENTION

The present invention relates most generally to semiconductor devices and more particularly to floating gate charge storage devices such as transistors.

BACKGROUND

Floating gate transistors are widely used in semiconductor manufacturing because of their ability to store charge in the floating gate disposed between lower and upper dielectrics formed beneath the gate electrode. Floating gate transistors are used to form flash memory cell structures such as discussed in K. Kim and G. Koh, "Future Memory Technology Including Emerging New Memories", Intl. Conf. on Microelectronics, p. 377-384, 2004, and G. Atwood, "Future Directions and Challenges for ETox™ Flash Memory Scaling", IEEE Trans. Device and Materials Reliability vol. 4, no. 3, September 2004. Such cell structures typically use a dual-poly floating gate structure with the polysilicon floating gate serving as a charge storage medium as shown in FIGS. 1A-1C. The tunnel-oxide of such devices is usually 90 angstroms—110 angstroms and the inter-poly or upper dielectric is usually a composite of ONO (Oxide-Nitride-Oxide) with an equivalent oxide thickness of about 200 angstroms to about 300 angstroms, roughly 2× or 3× the tunnel-oxide thickness. The thickness of the tunnel-oxide and upper dielectric are determined by the stringent retention requirements of retaining charge for greater than ten years at 125° C.

Programming of the floating gate flash memory cells is typically performed by channel hot electron (CHE) injection or channel F-N (Fowler-Nordheim) tunneling. Erasure of the cell is typically accomplished by F-N tunneling through the tunnel-oxide and into the channel. The cell may be an ETox™ cell based on either NMOS or PMOS transistors with floating gate storage of electrons or holes respectively. The channel current during the read operation is modulated by the amount of charge stored on the floating gate representing logic states "1" or "0". The amount of stored charge is limited by the material used for the floating gate which is typically a single polysilicon layer.

FIGS. 1A-1C illustrate a typical conventional floating gate transistor 100 that includes gate structure 102 formed over channel 104 formed in a substrate. Channel 104 is between source and drain regions 108. Gate structure 102 includes lower tunnel-oxide 110 and upper dielectric 112, described above, along with floating gate 114 and gate electrode 116. In such conventional floating gate transistors, each of gate electrode 116 and floating gate 114 are formed of a single layer of polycrystalline silicon. The exemplary floating gate transistor may be an ETox™ cell that includes p-well 122, n-well 124 and p-type substrate 126. FIGS. 1A-1C illustrate the exemplary floating gate transistor 100 in read, program, and erase operations, respectively. Charge is indicated by electrons 130.

The conventional technology is limited by the ability of the floating polysilicon gate to store charge. The minimum thickness of the tunnel-oxide in upper dielectrics is determined by the stringent requirement of charge retention for greater than ten years at 125° C. Once the thickness of these dielectric materials is determined, the cell size is then set by the required coupling ratio (typically about 0.8). Often the floating gate cell would benefit from increased area to accommodate larger capacitance coupling between the floating gate polysilicon and the control gate. An increase in device area is obviously is quite undesirable as the drive to increase integration levels mandates increasingly smaller features of smaller area.

As such, there is a need for better charge retention which will enable both the tunnel-oxide and the upper dielectric to be further scaled down without a trade-off to the retention performance or requiring an increase in size/area. Improved charge retention would enable the desirable result of further scaling down the cell size and also reducing the program/erase operating voltage accordingly. The present invention addresses these shortcomings and provides a floating gate with superior charge retention characteristics.

SUMMARY OF THE INVENTION

To address these and other objects, and in view of its purposes, the present invention provides a floating gate transistor comprising a lower tunnel-oxide formed over a substrate, an upper dielectric formed over the tunnel-oxide, an electrode formed over the upper dielectric, and a p-n junction formed between the tunnel-oxide and the upper dielectric.

In another aspect, provided is a floating gate transistor comprising a lower tunnel-oxide formed over a substrate, an upper dielectric formed over the tunnel-oxide, an electrode formed over the upper dielectric, and a quantum well formed between the tunnel-oxide and the upper dielectric.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

FIGS. 1A-1C are cross-sectional views showing three different logic states of a conventional floating gate transistor;

FIGS. 2A and 2B show two exemplary embodiments of gate structures of the inventive floating gate transistor;

FIGS. 4A-4C show energy level diagrams that illustrate hole quantum wells;

FIG. 5A is a cross-sectional view showing an exemplary floating gate transistor according to the invention.

FIGS. 5B-5D show the exemplary floating gate structure in various logic states.

DETAILED DESCRIPTION

Figure 3A:
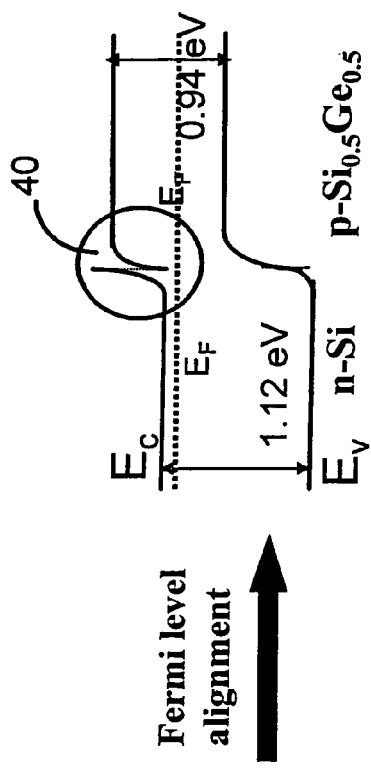
FIGS. 3A-3C show energy level diagrams that illustrate electron quantum wells.

The present invention provides a floating gate transistor which may be an ETox™ or other flash memory cell with a multi-layer floating gate that includes a quantum well for superior charge retention. A thin hetero-pn junction formed between two semiconductor layers may form the quantum well due to band edge offset. The two layers are formed of materials chosen to have different bandgaps. The quantum well confines charge therein and the storage of charge in the quantum well is used to identify the logic state of the device. The thin hetero-pn junction may be lightly doped with n- and p-type dopants respectively, so that it is fully depleted of mobile carriers. The charge trapped inside the quantum well and the fully depleted multi-layer structure leads to superior charge retention of the cell and provides for further scaling down dimensions of the tunnel-oxide and channel length and enables low voltage program/erase operations. For example, as a result of this superior retention, the tunnel-oxide and upper dielectric may be thinner than in conventional ETox™ cells enabling the coupling capacitance between the floating gate and the control gate to be larger which provides a desirably high coupling ratio without requiring extra coupling area size. The thinner tunnel-oxide enables the memory program/erase to be operated using a reduced voltage.

In one embodiment, the multi-layer floating gate structure may be a bi-level structure and in various embodiments the bi-layer structure may be Si/SiGe, Si/SiC, III-IV compound structures such as AlGaAs/GaAs, GaP/GaAs, InP/GaAs, AlN/GaAs, II-VI compound structures such as ZnSe/ZnTe, ZnS/ZnTe, CdS/CdTe, III-V/II-VI compound structures such as ZnSe/GaAs but other multi-layer structures may be used as the floating gate in other exemplary embodiments.

The multi-layer floating gate structure of the present invention may be applied to flash memory devices such as E-Tox™ developed by Intel, or other flash memory or other floating gate devices.

FIG. 2A shows an exemplary structure including a bi-layer floating gate. Transistor 1 is formed over substrate 13 which may be a bulk silicon substrate or may be silicon formed over an insulating substrate, a silicon-on-insulator (SOI) substrate. Substrate 13 may be p-type or n-type and includes channel 4 formed in substrate 13 along tunnel-oxide 9. Hence, transistor 1 may be an n-type or p-type transistor in different embodiments. Tunnel-oxide 9 may advantageously be a thermally formed oxide and includes thickness 19 which may range from 12 to 100 angstroms in exemplary embodiments. Bi-layer floating gate 3 includes two layers: semiconductor layer 5 and semiconductor layer 7. Top dielectric 11 is formed over bi-layer floating gate 3. Top dielectric 11 may be any of various state-of-the-art high-k materials such as $Al_2O_5$, HfSiON, or other suitable materials. Top dielectric 11 includes thickness 20 which may range from 12 to 100 angstroms in exemplary embodiments. Thicknesses 19 and 20 may be advantageously minimized due to the charge storage ability of bi-layer floating gate 3, and can be less than 70 and 90 angstroms, respectively. Control gate 15 is formed over top dielectric 11 and may be formed of metals such as W, Al, Co or other suitable metals or it may be formed of metal nitrides such as WN, TiN, or TaN or other suitable metal nitrides. In other exemplary embodiments, control gate 15 may be formed of silicides such as CoSi, TiSi, NiSi or other suitable silicides. Interface 17 formed between semiconductor layer 5 and semiconductor layer 7 represents a p-n junction that may form a quantum well.

The two semiconductor layers 5 and 7 are chosen so that one of the layers is a p-type layer and the other of the layers is an n-type layer that combine to form a hetero-pn junction and quantum well at interface 17 between the layers. In one embodiment, transistor 1 may be an n-type transistor with an electron quantum well formed at interface 17; in another exemplary embodiment, transistor 1 may be an n-type transistor with a hole quantum well formed at interface 17; and, in another exemplary embodiment, transistor 1 may be a p-type transistor with an electron or hole quantum well formed at interface 17. Semiconductor layer 5 and semiconductor layer 7 are chosen to have different bandgaps in order to trap charges (electrons or holes) in the quantum well formed at interface 17. Substrate 13 may include variously doped wells such as the substrate shown in FIGS. 1A-1C.

FIG. 2B shows another exemplary embodiment in which multi-layer floating gate 21 is formed of three layers: upper layer 23, middle layer 25 and lower layer 27. Each layer may be formed of a semiconductor material. In an exemplary embodiment, upper layer 23 and lower layer 27 may be formed of the same material with the same bandgap and middle layer 25 may be formed of a different material with a different bandgap thereby forming two interfaces 24 and 26, each of which may form a hetero-pn junction and therefore a quantum well. According to this exemplary embodiment, upper and lower layers 23 and 27 may be formed of an n-type material and middle layer 23 formed of a p-type material, or vice versa.

Figure 3B:
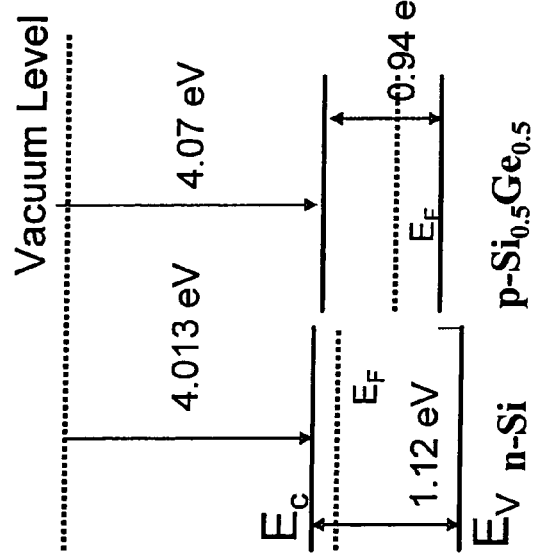
Figure 3C:
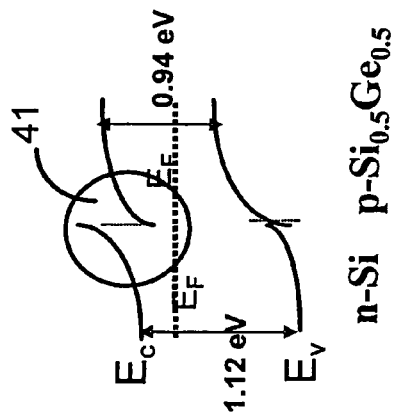

FIGS. 3A-3C illustrate an electron quantum well formed in an exemplary bi-layer floating gate formed of n-Si and p-SiGe. FIG. 3A shows separate bi-layer band diagrams of n-Si and p-$Si_{0.5}Ge_{0.5}$ prior to hetero-junction formation. The n-Si layer has a bandgap of 1.12 electron volts and p-$Si_{0.5}Ge_{0.5}$ a bandgap of 0.94 electron volts. The right hand side of FIG. 3A also shows a thick bi-layer hetero-junction with charge neutral region 40 and with aligned Fermi levels $E_F$. FIG. 3B shows a thin and fully depleted bi-layer hetero-junction including region 41. The offset of the conduction band between the two materials in the case when each of the layers are amorphous or polycrystalline, results in electrons accumulated i.e. trapped in the quantum well as shown in FIG. 3C. The depletion layer at the n-Si side having a positive charge serves as a higher barrier and greater distance for trapped electrons tunneling toward the n-Si side of the hetero-junction.

FIGS. 4A-4C show hole quantum well formation in an exemplary embodiment in which the floating gate is a bi-layer formed of p-Si and n-SiGe. FIG. 4A shows separate bi-layer band diagrams before hereto-junction formation and the right hand side of FIG. 4A also shows a thick bi-layer hereto-junction with a charge neutral region 44. FIG. 4B shows thin and fully depleted bi-layer hereto-junction 45; and FIG. 4C shows holes accumulated or trapped in the quantum well. In FIG. 4C, the depletion layer at the p-Si side serves as a higher barrier and greater distance for trapped holes tunneling toward the p-Si side.

In other exemplary embodiments, the exemplary Si/SiGe may be replaced by any combination of wide bandgap and narrower bandgap materials, for example SiC as the wider bandgap material and Ge as the narrower bandgap material. In an exemplary embodiment, the bandgaps of the two adjacent layers may differ by at least 0.5 eV. The materials may be amorphous, nanocrystalline, or nanoamorphous. In one embodiment, the multi-layer structure may be a bi-level structure and in various embodiments the bi-layer structure, i.e., semiconductor layers 5 and 7, may be Si/SiGe, Si/SiC, III-IV compound structures such as AlGaAs/GaAs, II-VI compound structures such as ZnSe/ZnTe or III-V/II-VI compound structures such as ZnSe/GaAs but other multi-layer structures may be used as the floating gate in other exemplary embodiments.

FIG. 5A shows an exemplary transistor 1 formed over substrate 13 and including source/drain regions 51. Stored charge 53 can be seen at interface 17. Stored charge 53 may be electrons or holes. In the illustrated embodiment and to describe the operation of one exemplary flash cell, an electron quantum well is formed at interface 17 and therefore stored charge 53 represents electrons. In the exemplary embodiment, the flash cell may be an n-type cell and therefore source/drain regions 51 are n+ materials. The hetero-pn junction formed at interface 17 stores stored charge 53. In this exemplary embodiment, semiconductor layer 5 may be n-Si and semiconductor layer 7 may be p-SiGe with different bandgaps. FIG. 5B shows the device of FIG. 1 in read operation with a Vcc voltage of +0.5 volts applied to control gate 15 and source/drain 51 producing current 63 through channel 4. FIG. 5C shows the device in program operation with a voltage of 5-10 volts applied at contact 59 to control gate 15. In other exemplary embodiments, a program voltage of no greater than 8 volts may be used. FIG. 5C illustrates electrons 61 tunneling toward the quantum well formed at interface 17 where they will be stored. FIG. 5D shows the device in erase operation and with a negative voltage of (−5)-(−10) volts applied to control gate 15 thereby causing electrons 61 to be erased or removed from floating gate 3. The charge carriers, in this case electrons 61, tunnel through tunnel-oxide 9 by either F-N tunneling when tunnel-oxide includes a thickness greater than 70 angstroms or direct tunneling when tunnel-oxide 9 has a lesser thickness. In other exemplary embodiments, an erase voltage of no greater than 8 volts may be used. It can be understood that the same but opposite principles apply when a hole quantum well is utilized.

Figure 6:
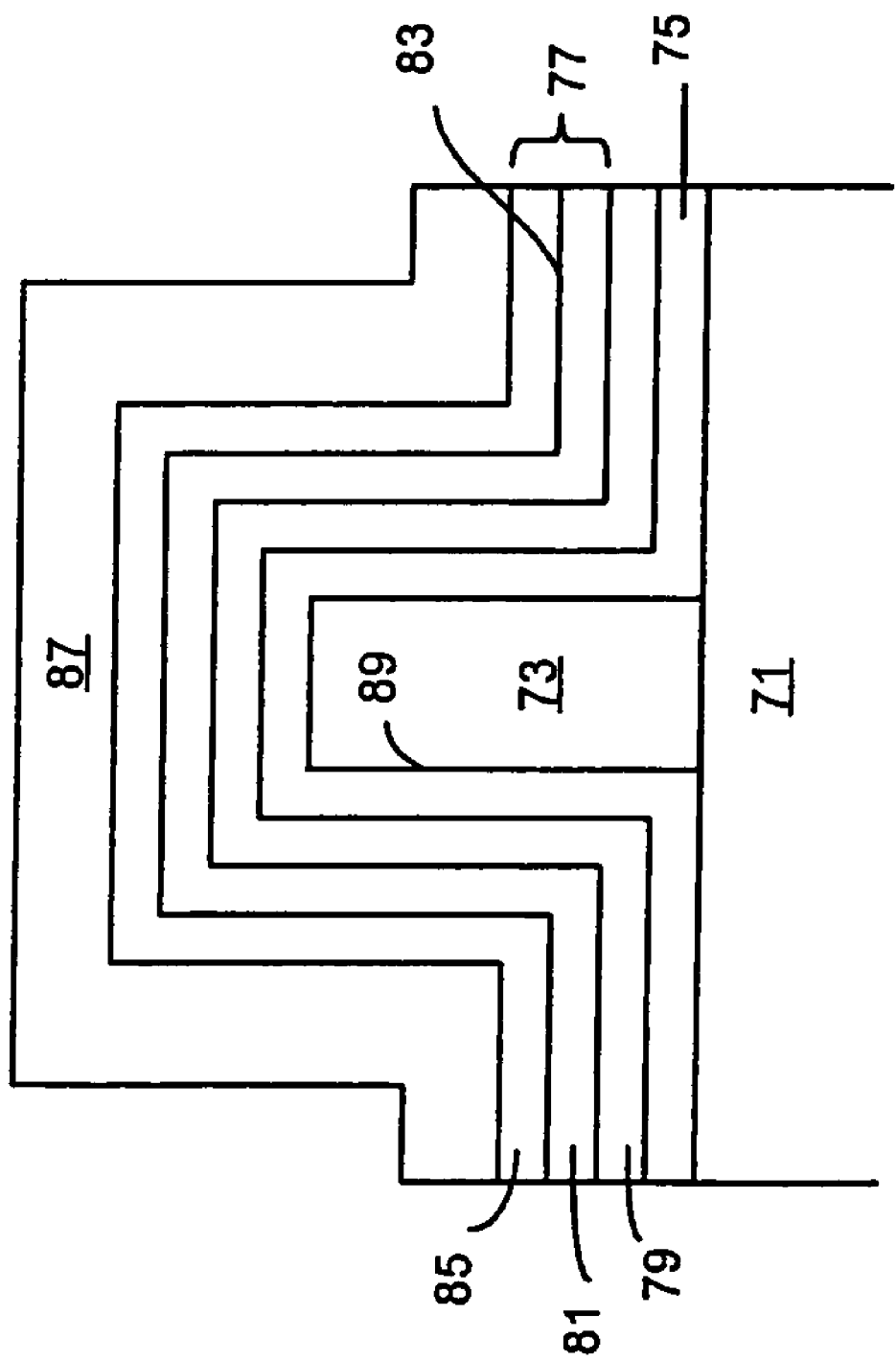
FIG. 6 is a cross-sectional view showing an exemplary floating gate transistor of the invention applied to a fin-FET.

FIG. 6 is a cross-sectional view showing a fin-FET that includes the multi-layer floating gate of the invention. The aforedescribed principles apply similarly to the structure shown in FIG. 6 which includes semiconductor fin 73 formed over substrate 71 which may be a semiconductor or SOI substrate. The fin-FET structure includes tunnel-oxide 75, upper dielectric 85 and bi-level floating gate 77 which includes semiconductor layer 79, semiconductor layer 81 and interface 83 formed between the two semiconductor layers. FIG. 6 also includes control gate 87. The fin-FET shown in FIG. 6 may be an n-type device, i.e., an n-type channel formed along surface 89 of fin 73, or a p-type fin-FET, and the quantum well may be a hole quantum well or electron quantum well.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical,", "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A floating gate transistor comprising:
   a lower tunnel-oxide formed over a substrate;
   an upper dielectric formed over said tunnel-oxide;
   a control gate formed over said upper dielectric;
   a semiconductor fin disposed directly on said substrate and wherein said lower tunnel-oxide is a layer that extends along said substrate and conterminously over sides and top of said semiconductor fin and a channel of said transistor is formed within said semiconductor fin; and
   a p-n junction formed between said tunnel-oxide and said upper dielectric, wherein said p-n junction is a heterojunction formed between two layers of semiconductor material having different bandgaps.

2. The floating gate transistor as in claim 1, wherein said p-n junction comprises a quantum well.

3. The floating gate transistor as in claim 1, wherein said different bandgaps differ by at least 0.05 ev.

4. The floating gate transistor as in claim 1, wherein said two layers of semiconductor material comprise a layer of SiGe and a layer of Si.

5. The floating gate transistor as in claim 1, wherein said two layers of semiconductor material comprise a first layer formed of III-V material and a second layer formed of II-VI material.

6. The floating gate transistor as in claim 1, wherein said two layers of semiconductor material comprise a layer of p-Si and a layer of n-SiGe.

7. The floating gate transistor as in claim 1, wherein said lower tunnel-oxide includes a thickness of less than 90 angstroms and said upper dielectric includes a thickness of less than 90 angstroms.

8. The floating gate transistor as in claim 1, wherein said floating gate transistor is erasable using a voltage no greater than 8 volts.

9. The floating gate transistor as in claim 1, wherein said floating gate transistor is programmable using a voltage no greater than 8 volts.

10. The floating gate transistor as in claim 1, wherein said floating gate transistor is an NMOS transistor and mobile carriers stored at said p-n junction comprise electrons.

11. The floating gate transistor as in claim 1, wherein said floating gate transistor is an NMOS transistor and mobile carriers stored at said p-n junction comprise holes.

12. The floating gate transistor as in claim 1, wherein said floating gate transistor comprises a PMOS transistor.

13. A floating gate transistor comprising:
    a lower tunnel-oxide formed over a substrate;
    an upper dielectric formed over said tunnel-oxide;
    a control gate formed over said upper dielectric; and
    a p-n junction formed between said tunnel-oxide and said upper dielectric, wherein said p-n junction is a heterojunction formed between two layers of semiconductor material having different bandgaps,
    wherein said two layers of semiconductor material comprise a layer of n-Si and a layer of p-SiGe and said p-n junction comprises an electron quantum well.

14. A semiconductor flash memory device comprising:
    a lower tunnel-oxide formed over a substrate;
    an upper dielectric formed over said tunnel-oxide;
    a control gate formed over said upper dielectric;
    a quantum well formed at a p-n junction disposed between said tunnel-oxide and said upper dielectric;

a semiconductor fin disposed directly on said substrate and wherein said lower tunnel-oxide is a layer that extends along said substrate and conterminously over sides and top of said semiconductor fin, wherein a channel of a transistor is formed within said semiconductor fin; and charge stored in said quantum well, wherein said p-n junction is a heterojunction formed between two layers of semiconductor material, said two layers of semiconductor material comprising an n-type layer adjacent a p-type layer and including respective bandgaps that differ by at least 0.05 eV.

15. A floating gate transistor comprising:

a lower tunnel-oxide formed over a substrate;

an upper dielectric formed over said tunnel-oxide;

a control gate formed over said upper dielectric; and a p-n junction and a further p-n junction formed between said tunnel-oxide and said upper dielectric, wherein each of said p-n junction and said further p-n junction is a heterojunction formed between two layers of semiconductor material having different bandgaps, said p-n junction and said further p-n junction created by three layers formed between said lower tunnel-oxide and said upper dielectric, said three layers including a middle semiconductor layer with a first bandgap interposed between an upper semiconductor layer and a lower semiconductor layer each formed of a material having a different bandgap than said middle semiconductor layer.

* * * * *